(12) United States Patent
Zeng

(10) Patent No.: US 10,192,505 B2
(45) Date of Patent: Jan. 29, 2019

(54) GOA DRIVE UNIT AND DRIVE CIRCUIT

(71) Applicant: Shenzhen China Star Optoelectronics Technology Co., Ltd., Shenzhen, Guangdong (CN)

(72) Inventor: Mian Zeng, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 236 days.

(21) Appl. No.: 15/324,700

(22) PCT Filed: Nov. 29, 2016

(86) PCT No.: PCT/CN2016/107602
§ 371 (c)(1),
(2) Date: Jan. 7, 2017

(87) PCT Pub. No.: WO2018/040321
PCT Pub. Date: Mar. 8, 2018

(65) Prior Publication Data
US 2018/0330687 A1    Nov. 15, 2018

(30) Foreign Application Priority Data
Aug. 31, 2016  (CN) .......................... 2016 1 0790773

(51) Int. Cl.
*G09G 3/36*    (2006.01)
*G02F 1/133*   (2006.01)
(Continued)

(52) U.S. Cl.
CPC ............. *G09G 3/3677* (2013.01); *G02F 1/13* (2013.01); *G02F 1/13306* (2013.01);
(Continued)

(58) Field of Classification Search
CPC ... G09G 2310/0283; G09G 2310/0286; G09G 3/3677; G09G 2310/06; G09G 2310/08;
(Continued)

(56) References Cited

U.S. PATENT DOCUMENTS 9,972,261 B2    5/2018  Wang et al.
2003/0210220 A1   11/2003  Hebiguchi
(Continued)

FOREIGN PATENT DOCUMENTS

| CN | 105355175 A | * | 2/2016 | ........... G09G 3/3696 |
| CN | 105390115 A | * | 3/2016 | ............... G09G 3/36 |
| CN | 106128397 |   | 11/2016 | |

*Primary Examiner* — Julie Anne Watko

(57) ABSTRACT

Disclosed is a GOA drive unit and drive circuit. The GOA drive unit includes a pull-up unit, a pull-up control unit, a pull-down unit, a pull-down holding unit, a bootstrap capacitor, and a pull-down transistor of an adjacent row. The pull-down transistor of an adjacent row is configured to pull down and hold a line scan signal of an adjacent row corresponding to a previous scanning sequence at a low level when a scan control signal and a line scan signal of a current row are pulled down and held at low levels by the pull-down holding unit. The GOA drive unit can improve the self-repairing ability of the GOA drive circuit.

8 Claims, 3 Drawing Sheets

(51) Int. Cl.
  *G02F 1/1345* (2006.01)
  *G02F 1/13* (2006.01)
  *H03K 17/687* (2006.01)

(52) U.S. Cl.
  CPC ........... *G02F 1/13454* (2013.01); *G09G 3/36* (2013.01); *G09G 2310/0264* (2013.01); *G09G 2310/0286* (2013.01); *G09G 2310/06* (2013.01); *G09G 2310/08* (2013.01); *G09G 2320/0204* (2013.01); *H03K 17/6871* (2013.01); *H03K 17/6874* (2013.01)

(58) Field of Classification Search
  CPC ... G09G 2320/0204; G09G 2310/0264; G09G 2310/00; G09G 2320/02; G09G 2320/00; G02F 1/13454; G02F 1/1345; G02F 1/13306; G02F 1/133; G02F 1/13; G02F 1/01; G02F 1/00; H03K 17/6871; H03K 17/6872; H03K 17/6874; H03K 17/687
  See application file for complete search history.

(56) References Cited

U.S. PATENT DOCUMENTS

| | | |
|---|---|---|
| 2007/0035505 A1 | 2/2007 | Lin et al. |
| 2011/0150169 A1 | 6/2011 | Lin et al. |
| 2016/0343332 A1 | 11/2016 | Cao |
| 2016/0343334 A1 | 11/2016 | Hao |
| 2017/0229082 A1 | 8/2017 | Du |

\* cited by examiner

GOA DRIVE UNIT AND DRIVE CIRCUIT

CROSS-REFERENCE TO RELATED APPLICATIONS

This application claims benefit of Chinese patent application CN 201610790773.3, entitled "GOA drive unit and drive circuit" and filed on Aug. 31, 2016, the entirety of which is incorporated herein by reference.

FIELD OF THE INVENTION

The present disclosure relates to the field of liquid crystal displays, and in particular, to a GOA drive unit and a drive circuit.

BACKGROUND OF THE INVENTION

A drive circuit of a traditional liquid crystal display device is typically in the form of an externally attached integrated circuit module, such as a widely used tape automated bonding package structure. However, with the development of low temperature poly silicon (LTPS) semiconductor thin-film transistors with high carrier mobility, an integrated circuit technology based on panel peripheries is becoming a focus. A typical application in this respect is gate driver on array (GOA) technology.

A GOA drive circuit uses an array process of a liquid crystal display device manufacturing process to manufacture a gate drive circuit on an array substrate, so as to realize a progressive scanning of pixel units. The GOA drive circuit can not only reduce welding operations for connecting an external integrated circuit and improve integration, but also improve productivity and lower production costs, and therefore is a preferred choice for small- and medium-sized liquid crystal display products such as mobile phones and PDAs. In addition, with the acceleration of a smart-up process of mobile phones, corresponding technological supports are required for touch control technology applied to small- and medium-sized liquid crystal display devices, and thus more requirements for drive circuits are put forward.

GOA drive circuits in the prior art have the following problems. On the one hand, parameters of a transistor have poor uniformity, and performance of the transistor may be affected after long-term work, which can further cause changes to the parameters. As a result, voltages at some key circuit nodes in the drive circuit may change, leading to a failure of a designed time sequence and function of the circuit in a severe case, and thus causing a failure of the entire GOA drive circuit. On the other hand, in a process of manufacturing the GOA drive circuit, short failures or open failures easily occur due to the presence of a large number of multistage circuits and transistors. In addition, repair difficulty of the circuit is high. Therefore, once such a failure occurs, a liquid crystal panel becomes a defective one, thereby badly affecting the yield rate of liquid crystal panels.

SUMMARY OF THE INVENTION

A technical problem to be solved by the present disclosure is the need to provide an improved GOA drive circuit, so as to stabilize key circuit nodal voltages, thereby avoiding failure caused by parametric variation of components thereof.

In order to solve the above technical problem, the present disclosure provides a GOA drive unit, a pull-up unit, a pull-up control unit, a pull-down unit, a pull-down holding unit, and a bootstrap capacitor. The GOA drive unit further comprises a pull-down transistor of an adjacent row, which is configured to pull down and hold a line scan signal of an adjacent row corresponding to a previous scanning timing at a low level when a scan control signal and a line scan signal of a current row are pulled down and held at low levels by the pull-down holding unit.

Preferably, the pull-down holding unit comprises a first pull-down transistor for pulling down and holding the scan control signal of the current row at a low level, and a second pull-down transistor for pulling down and holding the line scan signal of the current row at a low level. Drains of the first pull-down transistor and the second pull-down transistor are respectively connected to the scan control signal and the line scan signal. A drain of the pull-down transistor of an adjacent row is connected to the line scan signal of an adjacent row corresponding to a previous scanning timing, and a gate thereof is coupled to gates of the first pull-down transistor and the second pull-down transistor. Sources of the first pull-down transistor, the second pull-down transistor and the pull-down transistor of an adjacent row are all coupled to a DC pull-down voltage.

Preferably, the pull-down holding unit further comprises: a third pull-down transistor, a gate and a drain thereof being coupled together to receive a pull-down clock signal; a fourth pull-down transistor, a gate and a drain thereof being respectively coupled to a source and a drain of the third pull-down transistor; a fifth pull-down transistor and a sixth pull-down transistor. Drains of the fifth pull-down transistor and the sixth pull-down transistor are respectively coupled to a gate and a source of the fourth pull-down transistor, sources thereof are coupled to the DC pull-down voltage, and gates thereof are coupled together to receive the scan control signal. A drain of the sixth pull-down transistor is coupled to a coupled node of gates of the first pull-down transistor, the second pull-down transistor and the pull-down transistor of an adjacent row.

Preferably, the pull-down clock signal and a scanning clock signal of the GOA drive unit of the current row are equal in frequency but opposite in phase.

Preferably, the GOA drive unit further comprises a pass-down unit, which comprises a pass-down transistor. A gate of the pass-down transistor is connected to the scan control signal, a drain thereof is connected to a scanning clock signal of the GOA drive unit, and a source thereof is configured to generate a pass-down signal applied to a next-stage GOA drive unit.

Preferably, the pull-down holding unit comprises a circuit with a mirrored structure, which comprises: a first pull-down transistor and a third pull-down transistor used for pulling down and holding the scan control signal of the current row at a low level, and a second pull-down transistor and a fourth pull-down transistor used for pulling down and holding the line scan signal of the current row at a low level. The pull-down transistor of an adjacent row comprises a first pull-down transistor of an adjacent row and a second pull-down transistor of an adjacent row. Drains of the first pull-down transistor of an adjacent row and the second pull-down transistor of an adjacent row are both connected to the line scan signal of an adjacent row corresponding to a previous scanning timing. A gate and a source of the first pull-down transistor of an adjacent row are respectively coupled to gates and sources of the first pull-down transistor and the second pull-down transistor. A gate and a source of the second pull-down transistor of an adjacent row are respectively coupled to gates and sources of the third pull-down transistor and the fourth pull-down transistor. A source of each of the pull-down transistors is coupled to a DC pull-down voltage.

Preferably, the pull-down holding unit further comprises a first alternate control circuit and a second alternate control circuit, which are configured to be mirrored with each other. The first alternate control circuit comprises: a fifth pull-down transistor, a gate and a drain thereof being coupled together to receive a first alternate control signal; a sixth pull-down transistor, a gate and a drain thereof being respectively coupled to a source and a drain of the fifth pull-down transistor; a seventh pull-down transistor and an eighth pull-down transistor. Drains of the seventh pull-down transistor and the eighth pull-down transistor are respectively coupled to a gate and a source of the sixth pull-down transistor, sources thereof are coupled to the DC pull-down voltage, and gates thereof are coupled together to receive the scan control signal. A drain of the eighth pull-down transistor is coupled to a coupled node of gates of the first pull-down transistor, the second pull-down transistor and the first pull-down transistor of an adjacent row. The second alternate control circuit is configured with a mirrored structure corresponding to the first alternate control circuit, and is controlled by a second alternate control signal. The first alternate control signal and the second alternate control signal are alternately at high level and low level.

Preferably, frequencies of the first alternate control signal and the second alternate control signal are lower than that of a scanning clock signal of the GOA drive unit.

Preferably, the GOA drive unit further comprises a pass-down unit, which comprises a pass-down transistor. A gate of the pass-down transistor is connected to the scan control signal, a drain thereof is connected to a scanning clock signal of the GOA drive unit, and a source thereof is configured to generate a pass-down signal applied to a next-stage GOA drive unit.

The present disclosure, at another aspect, provides another GOA drive circuit, which is formed by the above cascaded GOA drive units, and is configured to interlacedly input two clock scanning signals with an equal frequency but opposite phases to each of the GOA drive units.

Compared with the prior art, one or more of the embodiments of the above invention may have the following advantages or beneficial effects.

Through an addition of a pull-down transistor to the current-stage GOA circuit and a pull-down holding operation performed to an output G(N−1) of a previous stage, the ability of holding an output of the GOA circuit at a low level is improved, and the performance of the circuit is further improved, so that the quality of products is increased. Moreover, when a pull-down holding circuit of the current stage fails, the pull-down holding function of the circuit can also be played by a pull-down holding circuit of a next stage, and a self-repairing ability of the GOA circuit can be improved.

Other advantages, objectives and features of the present disclosure will be further explained in part in the following description, and in part become self-evident to the skilled person in the art based on the study therefrom, or may be learned from practice of the present disclosure. The objectives and other advantages of the present disclosure will be achieved through the structures specifically pointed out in the description, claims, and the accompanying drawings.

BRIEF DESCRIPTION OF THE DRAWINGS

The accompanying drawings are provided for a further understanding of the technical solution of the present disclosure or the prior art, and constitute a part of the description, wherein the accompanying drawings used in illustrating the embodiments of the present disclosure together with the embodiments thereof serve to explain the technical solution thereof, and does not limit the technical solution thereof.

DETAILED DESCRIPTION OF THE EMBODIMENTS

The embodiments of the present disclosure will be explained in detail with reference to the embodiments and the accompanying drawings, so as to fully understand how to solve the technical problem by the technical means according to the present disclosure and achieve the technical effects thereof, and thus the technical solution according to the present disclosure can be implemented. As long as there is no structural conflict, any of the embodiments and any of the technical features thereof may be combined with each other, and the technical solutions obtained therefrom all fall within the scope of the present disclosure.

Figure 1:
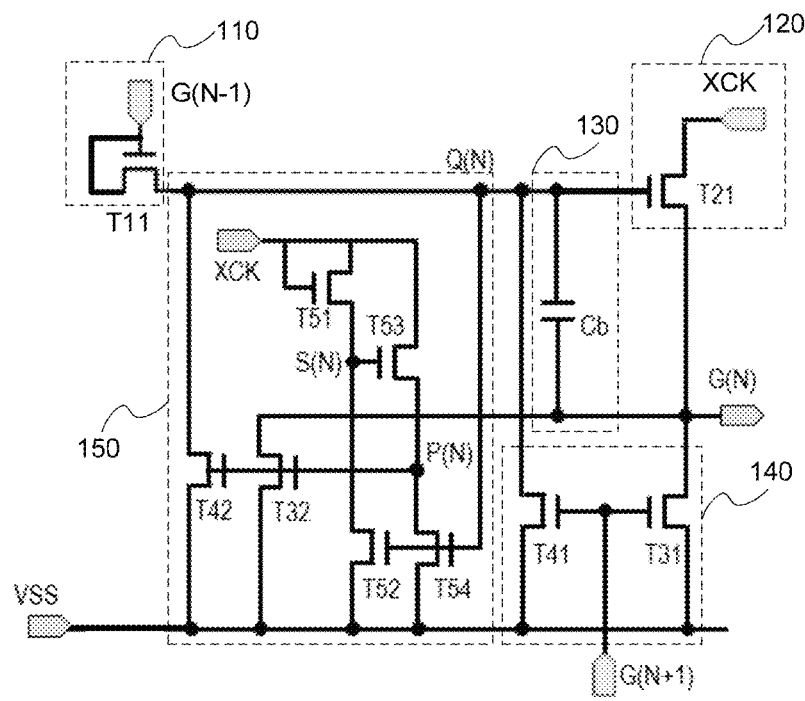
FIG. 1 schematically shows the structure of a GOA drive unit in the prior art.

A GOA drive circuit in the prior art generally comprises a plurality of cascaded GOA units. Each stage of GOA drive units corresponds to a horizontal scanning line. FIG. 1 schematically shows the structure of a GOA drive unit in the prior art. As depicted in FIG. 1, the GOA drive unit mainly comprises a pull-up control unit 110, a pull-up unit 120, a pull-down unit 140, a pull-down holding unit 150 and a bootstrap capacitor 130.

As shown in FIG. 1, voltages at all circuit nodes are determined by structures of corresponding stages of GOA drive units. For example, an active high-level at a scan control signal node Q(N), which is used for turning on a transistor T21 of the pull-up unit 120 is generated by a transistor T11 of the pull-up control unit 110, and holding of the node Q(N) at a low-level during scanning periods of other rows is realized by the pull-down holding unit 150 of a current stage. If a circuit failure occurs in the GOA drive unit of the current stage, e.g., a shorted or an open transistor due to the manufacture procedure thereof, output of the current-stage drive unit will be affected. The present disclosure improves the above structure, and provides a GOA drive unit that is capable of pulling down and holding a line scan signal of an adjacent row corresponding to a previous scanning timing at a low level when pulling down and holding a scan control signal and a line scan signal of the current row at low levels, so that the drive unit has a self-repairing ability. Detailed description will be given below based on embodiments.

Figure 2:
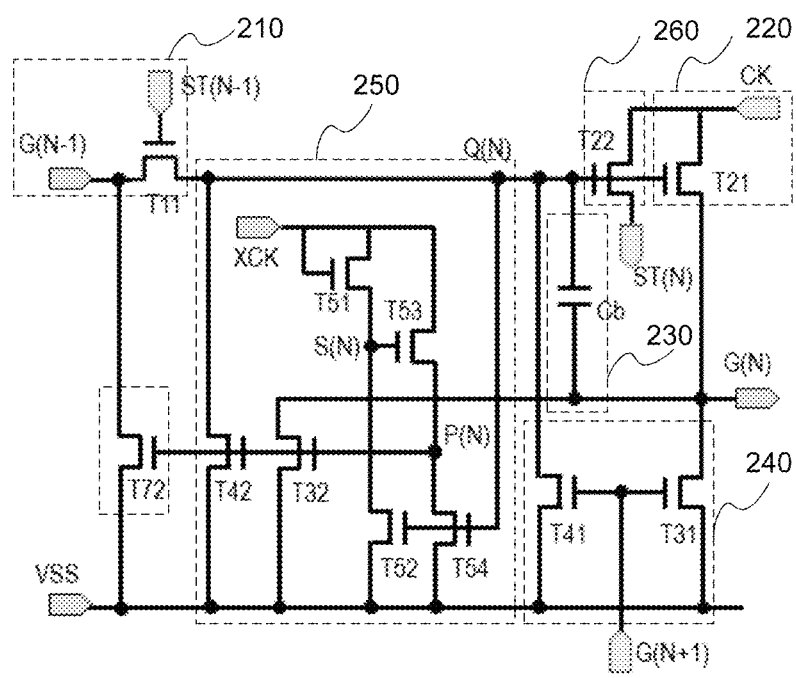
FIG. 2 schematically shows the structure of a GOA drive unit according to one embodiment of the present disclosure.

FIG. 2 schematically shows the structure of a GOA drive unit according to one embodiment of the present disclosure. As shown in FIG. 2, an $N^{th}$-stage GOA drive unit charges a horizontal scanning line G(N) of an $N^{th}$ row in a display region. The GOA unit comprises a pull-up control unit 210, a pull-up unit 220, a bootstrap capacitor 230, a pull-down unit 240, a pull-down holding unit 250, a pull-down transistor T72 of an adjacent row and a pass-down unit 260.

Specifically, the pull-up control unit 210 is mainly used for controlling a time for turning on the pull-up unit 220 to realize a progressive scanning of a liquid crystal panel. The pull-up control unit 210 may consist of a pull-up control transistor T11. As can be seen from FIG. 2, a gate of the pull-up control transistor T11 receives signal ST(N−1), which is a pass-down signal generated by a previous stage (an (N−1)$^{th}$ stage) of the current-stage GOA drive unit.

In the prior art (as shown in FIG. 1), an output signal from a previous stage, namely the line scan signal G(N−1), is used for turning on a drive unit of the current stage; a drain and a gate of the pull-up control transistor T11 are coupled with each other to receive a line scan signal outputted from the previous-stage GOA drive unit and a source thereof is configured to generate a scan control signal acting on a control signal input end of the pull-up unit. In this case, T11 serves as a diode, a gate-source voltage Vgs of which is 0, and a large leakage current is generated inside it.

In embodiments of the present disclosure, the pass-down unit 260 is added. As shown in FIG. 2, the pass-down unit 260 mainly includes a pass-down transistor T22. A gate and a drain of the pass-down transistor T22 are both connected to the pull-up unit 220, the gate being coupled to a control signal input end of the pull-up unit 220, and the drain being coupled to a clock signal input end of the pull-up unit 220. A source of the pass-down transistor T22 is configured to generate and output a pass-down signal ST(N) which acts on a gate of a pull-up control transistor T11 of a next-stage (an (N+1)$^{th}$ stage) GOA drive unit. A drain and a source of T11 are respectively connected to a horizontal scanning line G(N−1) at an (N−1)$^{th}$ stage and a node Q(N) at an Na$^{th}$ stage. Because a low potential of a pass-down signal ST(N−1) equals to a low level of a clock signal CK (or XCK), being generally −8V, and a low potential of a line scan signal G(N−1) equals to a value of VSS, being generally −6V, which causes the gate-source voltage Vgs to be less than 0. Thus, the leakage current of the node Q(N) of the current stage can be reduced in holding periods thereof through an addition of the pass-down unit 260.

Under the actions of a pass-down signal ST(N−1) and a line scan signal G(N−1) generated by a previous-stage drive unit, the pull-up control unit 210 generates a scan control signal Q(N), which is responsible for an operation timing of the whole GOA drive unit. When a line scanning runs to an N$^{th}$ stage, Q(N) is at a high level, which is used for turning on the pull-up unit 220 to output a line scan signal. When the line scanning runs in other rows, Q(N) needs to be held at a low level reliably, so that the pull-up unit 220 does not output a line scan signal. Therefore, in a design of a GOA drive unit and a drive circuit, a correct timing of Q(N) must be ensured.

The pull-up unit 220 is configured to transform a scanning clock signal to a line scan signal outputted. As shown in FIG. 2, the pull-up unit 220 comprises a pull-up transistor T21. A gate of the pull-up unit 220 is configured to act as a control signal input end of the pull-up unit 220 to receive a scan control signal Q(N) generated by the pull-up control unit 210, a drain thereof is configured to act as a clock signal input end of the pull-up unit 220 to receive a scanning clock signal XCK, and a source thereof is configured to act as a line scan signal output end of the pull-up unit 220 and is connected to an N$^{th}$ horizontal scanning line G(N), for generating and outputting a line scan signal G(N).

In addition, 230 in FIG. 2 is a bootstrap capacitor, a function of which is to store a gate-source voltage of the pull-up transistor T21 when Q(N) is at a high level. When G(N) outputs a line scan signal with a high level, the bootstrap capacitor can boost a potential of a gate of the pull-up transistor T21 for a second time, so as to ensure a reliable turned-on of the pull-up transistor T21 and a reliable output of the line scan signal. After completing scanning of a current row, G(N) outputs a low level, and holds the low level all along during scanning periods of other rows.

The pull-down unit 240 is configured to pull down potentials of a source and a gate of the pull-up transistor T21 to low levels as early as possible, i.e., turning off the line scan signal G(N) for scanning. As shown in FIG. 2, the pull-down unit 240 comprises a pull-down transistor T31 and a pull-down transistor T41. T31 is used to pull down a potential of the line scan signal G(N). A drain of T31 is coupled to the line scan signal output end of the pull-up unit 220, acting on the N$^{th}$ horizontal scanning line. T41 is used to pull down the scan control signal Q(N), so as to turn off the pull-up transistor T21. A drain of T41 is coupled to the control signal input end of the pull-up unit 220. Gates of T31 and T41 are coupled together, and are connected to an (N+1)$^{th}$ horizontal scanning line G(N+1), so as to receive a line scan signal G(N+1) from a next stage of current GOA drive unit. A turning-off operation to the line scan signal of the current row is controlled by an effective line scan signal of a next row, so that a progressive scanning can be achieved. Sources of T31 and T41 are both coupled to a DC VSS of low voltage.

When the line scan signal G(N+1) of a next stage returns to a low level, G(N) and Q(N) cannot be held at low levels. Therefore, the GOA drive unit provides a pull-down holding unit 250 to keep G(N) and Q(N) staying in turned-off states (i.e., negative potentials).

As shown in FIG. 2, the pull-down holding unit 250 comprises transistors T42 and T32. T42 (a first pull-down transistor) is used to pull down and hold the scan control signal Q(N) of the current row at a low level during scanning periods of other rows, and T32 (a second pull-down transistor) is used to pull down and hold the line scan signal G(N) of the current row at a low level during scanning periods of other rows. Further, a drain of T42 is connected to the scan control signal Q(N), and a drain of T32 is connected to the line scan signal G(N). Gates and sources of T42 and T32 are respectively coupled together, and sources of T42 and T32 are coupled to the DC VSS of fixed pull-down voltage. Potentials of gates of T43 and T32 (node P(N) as shown in FIG. 2) are controlled by a control circuit of the pull-down holding unit 250.

As shown in FIG. 2, the control circuit of the pull-down holding unit 250 comprises transistors T51, T52, T53 and T54. A gate and a source of the transistor T51 (a third pull-down transistor) are coupled together to receive a pull-down clock signal (XCK). A gate and a drain of the transistor T53 (a fourth pull-down transistor) are respectively coupled to a source and a drain of the transistor T51. A source of T53 (node P(N)) outputs a voltage signal which controls the operations of transistors T42 and T32. A drain of T52 (a fifth pull-down transistor) is coupled to a gate of T53. A drain of T54 (a sixth pull-down transistor) is coupled to the source of T53. Gates of T52 and T54 are coupled together and connected to the scan control signal Q(N), sources thereof are coupled to the DC VSS providing with pull-down voltage.

A GOA drive circuit is built by a plurality of cascade GOA drive units. In order to lighten the load of the GOA drive circuit and to improve the drive capacity thereof, the circuit is generally configured to be driven by a plurality of scanning clock signals jointly. Taking two scanning clock signals CK and XCK as examples according to an embodiment of FIG. 3, CK and XCK are equal in frequency but opposite in phase, and are interlacedly input to a clock signal input end of the pull-up unit 220 of each of the GOA drive units. It should be noted that the clock signal XCK, which is not shown at a clock signal input end of the pull-up unit 220 in FIG. 2, is connected to an $(N-1)^{th}$-stage drive unit.

Figure 3:
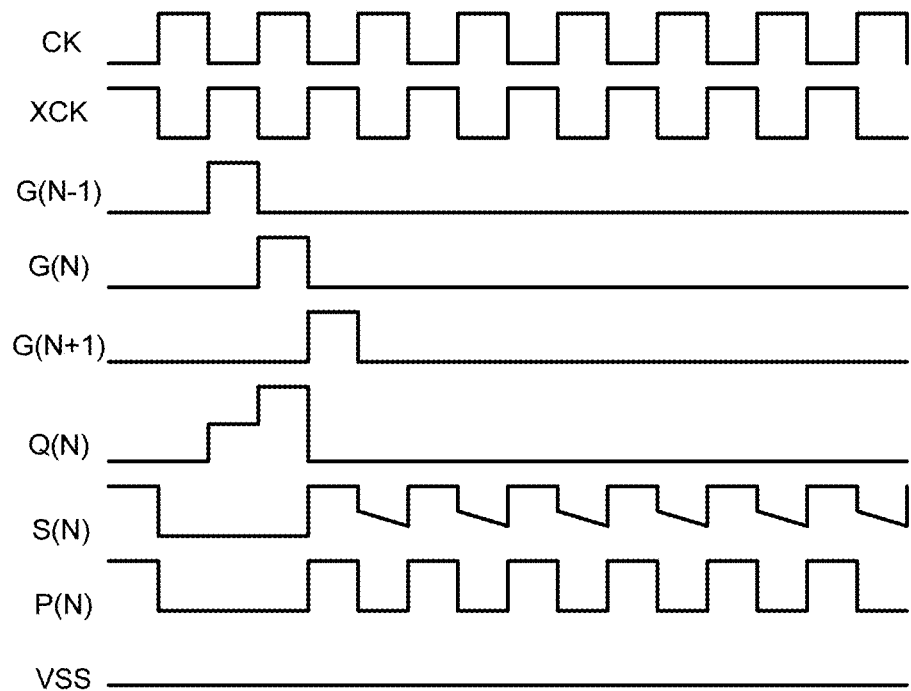
FIG. 3 schematically shows a signal waveform of a GOA drive unit during operation according to one embodiment of the present disclosure.

As shown in FIG. 3, under the action of the scanning clock signal XCK, when the line scan signal G(N−1) and the pass-down signal ST(N−1), corresponding to a previous scanning timing, output high levels, the pull-up control transistor T11 of an $N^{th}$-stage drive unit is turned on, and the scan control signal Q(N) reaches a first voltage value, which can turn on the pull-up transistor T21 and the pass-down transistor T22 of the $N^{th}$-stage drive unit.

After T21 and T22 are turned on, and when the clock signal CK reaches its high level, the line scan signal G(N) and the pass-down signal ST(N) output high levels according to CK simultaneously. When an $N^{th}$ row of pixels is under scanning, the pull-up control transistor of a $(N+1)^{th}$-stage drive unit receives the high levels of G(N) and ST(N). When the line scan signal G(N+1) of a next row changes to high level, pull-down transistors T31 and T41 of an $N^{th}$-stage drive unit are turned on, and G(N) and Q(N) are thus pulled down to low levels to end the scanning for the $N^{th}$ row of pixels. When G(N+1) returns to a low level, low levels of G(N) and Q(N) are held by the pull-down holding unit 250.

The first voltage value of the scan control signal Q(N) turns on T52 and T54, and T52 and T54 pull down S(N) and P(N) to low levels simultaneously after they are turned on. Because gate potentials of the transistors T32 and T42 are controlled by node P(N), T32 and T42 are securely able to be in turned-off states at the moment, which does not affect Q(N) and G(N). A potential of node Q(N) will be boosted when G(N) goes high, thus although G(N−1) and ST(N−1) are down to low levels, the voltage of node P(N) is able to keep T32 and T42 staying in turned-off states when G(N) is high.

After Q(N) and G(N) are pulled down to low levels, T52 and T54 are turned off. In addition, as shown in FIG. 2, a pull-down clock signal of the pull-down holding unit 250 adopts an XCK signal out of an interlaced scanning clock signal. When node S(N) is at a low level, XCK is at its high level and T51 is in a turned-on state, so that when T52 is turned off, the potential of node S(N) will be raised due to the high level of XCK. When S(N) is raised to a high-level potential, in which the difference value between the potential of S(N) and the potential of P(N) reaches to the turning-on threshold of the transistor T53, T53 is turned on. After T53 is turned on, P(N) is raised to a high level due to the high level of XCK, and T32 and T42 are thus turned on to hold Q(N) and G(N) at low levels.

As further illustrated in FIG. 3, when XCK is at a low level, T51 is turned off, and a potential of S(N) will fall to a certain degree. It can be seen from the simulation results shown in FIG. 3 that if high and low potentials of XCK are respectively 28V and −8V, the potential of S(N) will first drop to about 5V, and then gradually leak to about −1.5V when XCK changes from a high level to a low level. A voltage about 5V is sufficient to turn on T53, thus in the initial period after XCK changes to a low level, T53 is kept in a turned-on state, and a low level of XCK is further transferred to point P(N). That is, T42 and T32 will then be turned off, thus Q(N) holds its low level by relying on itself during a low level period of XCK. When a next high level of XCK comes, both T51 and T53 change to turned-on states, the high level of XCK is then transferred to node P(N), and T42 and T32 are thus turned on to perform a pull-down holding operation to node Q(N).

Although node Q(N) need to holds its low level by relying on itself during part of the time of the pull-down holding period, the pull-down holding operation can be correctly performed due to a high frequency scanning clock signal XCK being used as a pull-down clock signal. In addition, due to the direct use of XCK served as the pull-down clock signal, the introduction of other signal lines is omitted, and the space for wiring can be saved, thereby promoting the manufacture thereof.

A pull-down transistor of an adjacent row is provided in this embodiment. As further illustrated in FIG. 2, a drain of a pull-down transistor T72 of an adjacent row is connected to the line scan signal G(N−1) of an adjacent row (an $(N-1)^{th}$ row shown in FIG. 2) corresponding to a previous scanning timing, and a gate thereof is coupled to gates of T42 and T32. Because the gate of the pull-down transistor T72 of an adjacent row is also connected to node P(N), and both turned-on and turned-off operations thereof are controlled by node P(N), i.e. being synchronized with T42 and T32, G(N−1) is able to be held at a low level by T72 when P(N) is high. The pull-down transistor of an adjacent row can improve the reliability of the circuit and enhance the self-repairing ability of the circuit. This is because a circuit function failure will not happen and a normal operation of the circuit can still be guaranteed via T72 if a failure exists in the pull-down holding unit of an $(N-1)^{th}$-stage of the drive circuit, for example, a disconnection occurred in the transistor T32. This embodiment can significantly improve the reliability of the GOA drive circuit.

Figure 4:
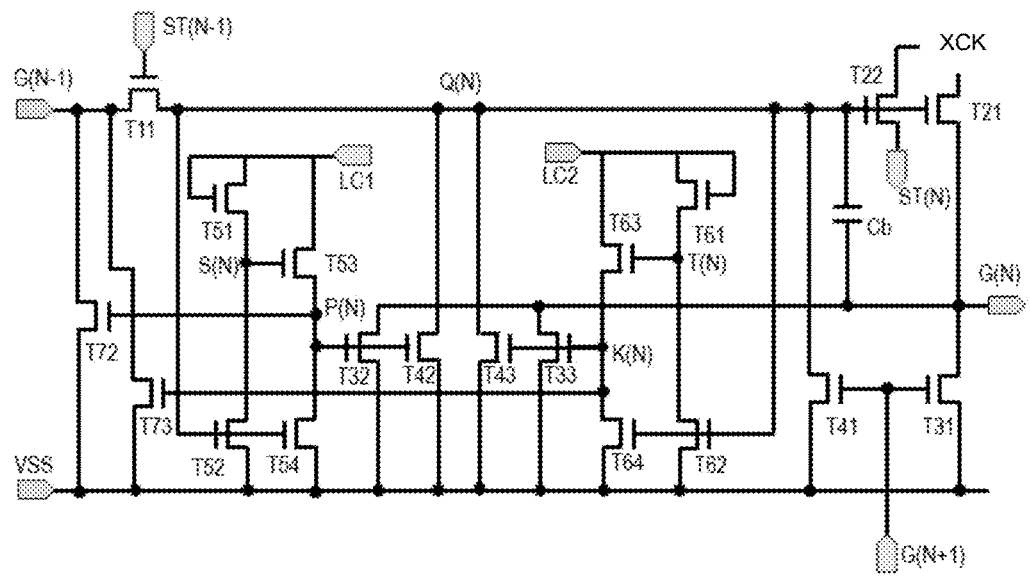
FIG. 4 schematically shows the structure of a GOA drive unit according to another embodiment of the present disclosure.

FIG. 4 schematically shows the structure of a GOA drive unit according to another embodiment of the present disclosure. In this embodiment, the pull-down holding unit is a circuit with a mirrored structure. When a transistor is under a long-term influence of a direct current signal, a direct current stress (DC stress) is created. The performance of the transistor will be influenced due to the stress and a failure of the transistor will be caused. A mirrored circuit can reduce the influence of the direct current stress caused by the direct current signal.

As shown in FIG. 4, the GOA drive unit mainly comprises a pull-up control unit, a pull-up unit, a bootstrap capacitor, a pull-down unit, and a pull-down holding unit. The pull-up control unit, the pull-up unit, the bootstrap capacitor and the pull-down unit have all the structures and functions of those provided in the above embodiments; details of them thus will not be further described herein.

In this embodiment, the pull-down holding unit comprises two circuits with mirrored structures with each other. Specifically, the pull-down holding unit includes a transistor T42 (a first pull-down transistor) and a transistor T43 (a third pull-down transistor), both of which are used for pulling down and holding the scan control signal Q(N) of a current row at a low level, and a transistor T32 (a second pull-down transistor) and a transistor T33 (a fourth pull-down transistor), both of which are used for pulling down and holding the line scan signal G(N) of the current row at a low level.

The pull-down holding unit further comprises mirrored structures namely a first alternate control circuit and a second alternate control circuit. The first alternate control circuit comprises a transistor T51 (a fifth pull-down transistor), a transistor T53 (a sixth pull-down transistor), a transistor T52 (a seventh pull-down transistor), and a transistor T54 (an eighth pull-down transistor). The first alternate control circuit has the same connection structures as the control circuit of previous embodiments. Specifically, a gate and a drain of the transistor T51 are coupled with each other to receive a first alternate control signal LC1; a gate and a drain of the transistor T53 are respectively coupled to a source and a drain of the transistor T51; drains of the transistors T52 and T54 are respectively coupled to a gate and a source of the transistor T53, sources thereof are both coupled to a DC VSS providing with a pull-down voltage, and gates thereof are coupled with each other to receive a scan control signal Q(N). A drain of the transistor T54 is coupled to gates of the transistors T42 and T32, and the drain (node P(N)) of the transistor T54 outputs the voltage signal which is used for controlling actions of the transistors T42 and T32.

The second alternate control circuit is configured with a mirrored structure corresponding to the first alternate control circuit, and actions thereof are controlled by a second alternate control signal LC2. LC1 and LC2 are alternately at high and low levels. When LC1 is at a high level and LC2 is at a low level, the first alternate control circuit controls and operates the mirrored circuit on the left (T32, T42, T51, T52, T53 and T54), and when LC1 is at a low level and LC2 is at a high level, the second alternate control circuit controls and operates the mirrored circuit on the right (T33, T43, T61, T62, T63 and T64).

As further shown in FIG. 4, a first pull-down transistor T72 of an adjacent row and a second pull-down transistor T73 of an adjacent row which are corresponding to mirrored configurations of the two control circuits are respectively provided in the two control circuits. Drains of T72 and T73 are both connected to the line scan signal G(N−1) of an adjacent row (an (N−1)$^{th}$ row in FIG. 4) corresponding to a previous scanning timing; a gate of T72 is coupled to gates of T42 and T32, and turned-on and turned-off operations thereof are controlled by node P(N). A gate of T73 is coupled to gates of T43 and T33, and turned-on and turned-off operations thereof are controlled by node K(N). Sources of T72 and T73 are both coupled to the DC VSS providing with a pull-down voltage.

Figure 5:
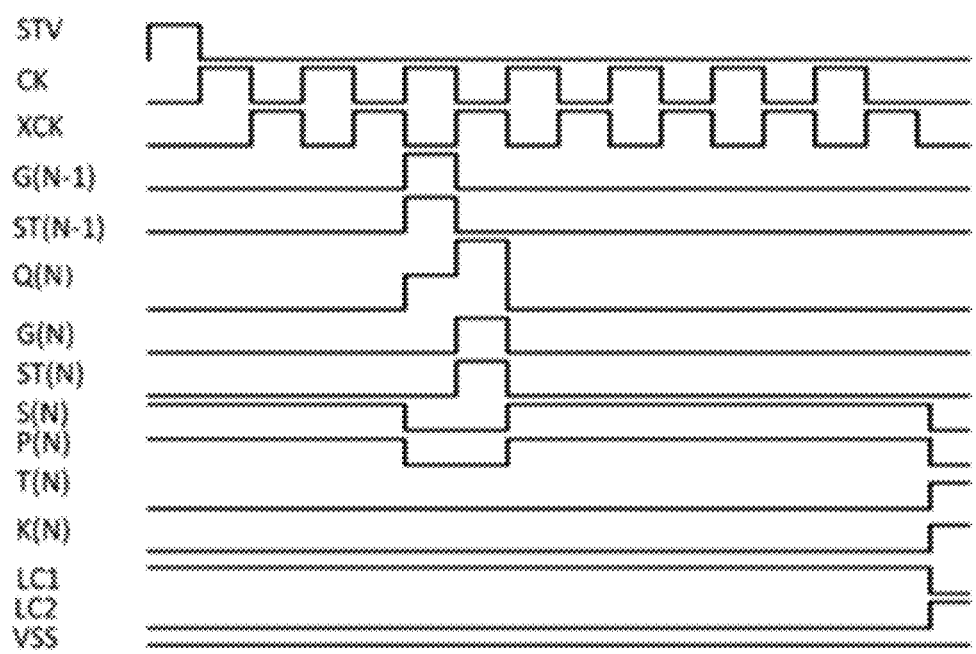
FIG. 5 schematically shows a signal waveform of a GOA drive unit during operation according to another embodiment of the present disclosure.

It is assumed that LC1 is at a high level and LC2 is at a low level, the mirrored circuit on the left (T32, T42, T51, T52, T53 and T54) is controlled by LC1 in connection with FIG. 4 and FIG. 5, and the operation thereof can be performed with reference to previous embodiments, which is not further described herein. It should be noted that the alternate control signals LC1 and LC2 are no longer signals of high frequency, and the frequency thereof is less than that of the scanning clock signals of the GOA drive unit, and thus the signals Q(N), G(N) and G(N−1) can be more efficiently held at low levels when node P(N) is always kept at a high level in pull-down holding periods.

For a GOA drive circuit in the prior art, pull-down holding operations of the pull-down holding unit thereof are only performed to a node Q and a line scan signal of an current stage. However, in embodiments of the present disclosure, through an addition of pull-down transistors acting on adjacent rows to the current stage of the existing GOA circuit, and meanwhile performing the pull-down holding operation to a line scan signal of a previous stage, the ability of holding an output of a GOA circuit at a low level is largely improved, and the drive performance of the circuit is further improved, so that the quality of liquid display panels is increased.

Due to an addition of operations performed on adjacent rows, when a pull-down holding unit of the current-stage drive unit fails, a pull-down holding function can also be played by a pull-down holding unit of a next stage, and thus a self-repairing ability of the GOA circuit is increased. When an element of the drive circuit malfunctions due to a manufacturing process or a failure resulted from a long-time operation, a correct and continuous operation to the circuit may be guaranteed via mutual operations of adjacent rows, which can help to improve the yield rate of GOA panels to some extent.

The above embodiments are described only for better understanding, rather than restricting, the present disclosure. Any person skilled in the art can make amendments to the implementing forms and details without departing from the spirit and scope of the present disclosure. The scope of the present disclosure should still be subjected to the scope defined in the claims.

The invention claimed is:

1. A GOA drive unit, comprising: a pull-up unit, a pull-up control unit, a pull-down unit, a pull-down holding unit, and a bootstrap capacitor,
   wherein the pull-up unit is configured to transform a scanning clock signal inputted to a line scan signal outputted, the pull-up control unit is linked to the pull-up unit and used to provide a scan control signal to the pull-up unit for controlling a time for turning on the pull-up unit, the pull-down unit is linked to the pull-up unit and used for controlling a turning-off operation to the line scan signal by an effective line scan signal of a next row, the pull-down holding unit is linked to the pull-up control unit and the pull-up unit and used to pull down and hold the scan control signal and the line scan signal at a low level during scanning periods of other rows, and the bootstrap capacitor is linked to the pull-up unit and used to ensure a reliable turned-on of the pull-up unit and a reliable output of the line scan signal;
   wherein the GOA drive unit further comprises:
   a pull-down transistor of an adjacent row, which is configured to pull down and hold a line scan signal of an adjacent row corresponding to a previous scanning timing at a low level when a scan control signal and a line scan signal of a current row are pulled down and held at low levels by the pull-down holding unit;
   wherein the pull-down holding unit comprises a first pull-down transistor for pulling down and holding the scan control signal of the current row at a low level, and a second pull-down transistor for pulling down and holding the line scan signal of the current row at a low level,
   wherein drains of the first pull-down transistor and the second pull-down transistor are respectively connected to the scan control signal and the line scan signal,
   wherein a drain of the pull-down transistor of an adjacent row is connected to the line scan signal of an adjacent row corresponding to a previous scanning timing, and a gate thereof is coupled to gates of the first pull-down transistor and the second pull-down transistor, and
   wherein sources of the first pull-down transistor, the second pull-down transistor and the pull-down transistor of an adjacent row are all coupled to a DC pull-down voltage.

2. The GOA drive unit according to claim 1,
   wherein the pull-down holding unit further comprises:
   a third pull-down transistor, a gate and a drain thereof being coupled together to receive a pull-down clock signal;

a fourth pull-down transistor, a gate and a drain thereof being respectively coupled to a source and a drain of the third pull-down transistor;

a fifth pull-down transistor and a sixth pull-down transistor, wherein drains of the fifth pull-down transistor and the sixth pull-down transistor are respectively coupled to a gate and a source of the fourth pull-down transistor, sources thereof are coupled to the DC pull-down voltage, and gates thereof are coupled together to receive the scan control signal, and wherein a drain of the sixth pull-down transistor is coupled to a coupled node of gates of the first pull-down transistor, the second pull-down transistor and the pull-down transistor of an adjacent row.

3. The GOA drive unit according to claim 2, wherein the pull-down clock signal and a scanning clock signal of the GOA drive unit of the current row are equal in frequency but opposite in phase.

4. The GOA drive unit according to claim 1, wherein the GOA drive unit further comprises a pass-down unit, which comprises a pass-down transistor, wherein a gate of the pass-down transistor is connected to the scan control signal, a drain thereof is connected to a scanning clock signal of the GOA drive unit, and a source thereof is configured to generate a pass-down signal applied to a next-stage GOA drive unit.

5. A GOA drive unit, comprising: a pull-up unit, a pull-up control unit, a pull-down unit, a pull-down holding unit, and a bootstrap capacitor, wherein the pull-up unit is configured to transform a scanning clock signal inputted to a line scan signal outputted, the pull-up control unit is linked to the pull-up unit and used to provide a scan control signal to the pull-up unit for controlling a time for turning on the pull-up unit, the pull-down unit is linked to the pull-up unit and used for controlling a turning-off operation to the line scan signal by an effective line scan signal of a next row, the pull-down holding unit is linked to the pull-up control unit and the pull-up unit and used to pull down and hold the scan control signal and the line scan signal at a low level during scanning periods of other rows, and the bootstrap capacitor is linked to the pull-up unit and used to ensure a reliable turned-on of the pull-up unit and a reliable output of the line scan signal;

wherein the GOA drive unit further comprises:

a pull-down transistor of an adjacent row, which is configured to pull down and hold a line scan signal of an adjacent row corresponding to a previous scanning timing at a low level when a scan control signal and a line scan signal of a current row are pulled down and held at low levels by the pull-down holding unit;

wherein the pull-down holding unit comprises a circuit with a mirrored structure, which comprises:

a first pull-down transistor and a third pull-down transistor used for pulling down and holding the scan control signal of the current row at a low level, and a second pull-down transistor and a fourth pull-down transistor used for pulling down and holding the line scan signal of the current row at a low level, wherein the pull-down transistor of an adjacent row comprises a first pull-down transistor of an adjacent row and a second pull-down transistor of an adjacent row, wherein drains of the first pull-down transistor of an adjacent row and the second pull-down transistor of an adjacent row are both connected to the line scan signal of an adjacent row corresponding to a previous scanning timing, wherein a gate and a source of the first pull-down transistor of an adjacent row are respectively coupled to gates and sources of the first pull-down transistor and the second pull-down transistor, and wherein a gate and a source of the second pull-down transistor of an adjacent row are respectively coupled to gates and sources of the third pull-down transistor and the fourth pull-down transistor, and wherein a source of each of the pull-down transistors is coupled to a DC pull-down voltage.

6. The GOA drive unit according to claim 5, wherein the pull-down holding unit further comprises a first alternate control circuit and a second alternate control circuit, which are configured to be mirrored with each other, wherein the first alternate control circuit comprises:

a fifth pull-down transistor, a gate and a drain thereof being coupled together to receive a first alternate control signal;

a sixth pull-down transistor, a gate and a drain thereof being respectively coupled to a source and a drain of the fifth pull-down transistor;

a seventh pull-down transistor and an eighth pull-down transistor, wherein drains of the seventh pull-down transistor and the eighth pull-down transistor are respectively coupled to a gate and a source of the sixth pull-down transistor, sources thereof are coupled to the DC pull-down voltage, and gates thereof are coupled together to receive the scan control signal, and wherein a drain of the eighth pull-down transistor is coupled to a coupled node of gates of the first pull-down transistor, the second pull-down transistor and the first pull-down transistor of an adjacent row; and wherein the second alternate control circuit is configured with a mirrored structure corresponding to the first alternate control circuit, and is controlled by a second alternate control signal, wherein the first alternate control signal and the second alternate control signal are alternately at high level and low level.

7. The GOA drive unit according to claim 6, wherein frequencies of the first alternate control signal and the second alternate control signal are lower than that of a scanning clock signal of the GOA drive unit.

8. The GOA drive unit according to claim 5, wherein the GOA drive unit further comprises a pass-down unit, which comprises a pass-down transistor, wherein a gate of the pass-down transistor is connected to the scan control signal, a drain thereof is connected to a scanning clock signal of the GOA drive unit, and a source thereof is configured to generate a pass-down signal applied to a next-stage GOA drive unit.

* * * * *